(12) United States Patent
Kishida

(10) Patent No.: US 8,952,461 B2
(45) Date of Patent: Feb. 10, 2015

(54) SEMICONDUCTOR DEVICE, DESIGNING METHOD THEREFOR, AND MANUFACTURING METHOD THEREFOR

(71) Applicant: Elpida Memory, Inc., Tokyo (JP)

(72) Inventor: Takeshi Kishida, Tokyo (JP)

(73) Assignee: PS4 Luxco S.A.R.L., Luxembourg (LU)

( * ) Notice: Subject to any disclaimer, the term of this patent is extended or adjusted under 35 U.S.C. 154(b) by 150 days.

(21) Appl. No.: 13/795,330

(22) Filed: Mar. 12, 2013

(65) Prior Publication Data
US 2013/0264655 A1   Oct. 10, 2013

(30) Foreign Application Priority Data

Apr. 9, 2012  (JP) ................... 2012-088775

(51) Int. Cl.
| | |
|---|---|
| H01L 29/76 | (2006.01) |
| H01L 29/94 | (2006.01) |
| H01L 23/535 | (2006.01) |
| H01L 21/8238 | (2006.01) |
| H01L 27/108 | (2006.01) |

(52) U.S. Cl.
CPC ...... *H01L 23/535* (2013.01); *H01L 21/823842* (2013.01); *H01L 21/823857* (2013.01); *H01L 21/823871* (2013.01); *H01L 21/823878* (2013.01); *H01L 27/10814* (2013.01); *H01L 27/10823* (2013.01); *H01L 27/10894* (2013.01); *H01L 27/10855* (2013.01); *H01L 27/10876* (2013.01); *H01L 27/10885* (2013.01); *H01L 27/10888* (2013.01)
USPC ............................ 257/392; 257/296; 438/238

(58) Field of Classification Search
CPC . H01L 27/1052; H01L 23/535; H01L 27/108; H01L 27/11526
USPC ................... 257/392, 296; 438/238
See application file for complete search history.

(56) References Cited

U.S. PATENT DOCUMENTS

| | | | | |
|---|---|---|---|---|
| 5,612,557 A | * | 3/1997 | Kondo et al. ................ | 257/288 |
| 2004/0094793 A1 | * | 5/2004 | Noguchi et al. ............. | 257/315 |

FOREIGN PATENT DOCUMENTS

| | | |
|---|---|---|
| JP | 2006-024594 | 1/2006 |
| JP | 2007-329237 | 12/2007 |

* cited by examiner

*Primary Examiner* — Theresa T Doan
(74) *Attorney, Agent, or Firm* — Young & Thompson

(57) ABSTRACT

In a semiconductor device including active regions which are adjacent to each other with an element isolation region interposed therebetween and which are different in height from the element isolation region, when a contact is formed in a gate wiring on the element isolation region, a contact failure is caused. Provided is a semiconductor device including an element isolation region, two active regions adjacent to each other with the element isolation region interposed therebetween and having surfaces which are higher than that of the element isolation region, a gate wiring commonly led from the respective active regions and extending through the element isolation region, and a contact for connecting the gate wiring to a conductor layer above the gate wiring. The contact is provided in a region other than the element isolation region, or is provided in an expanded element isolation region.

14 Claims, 26 Drawing Sheets

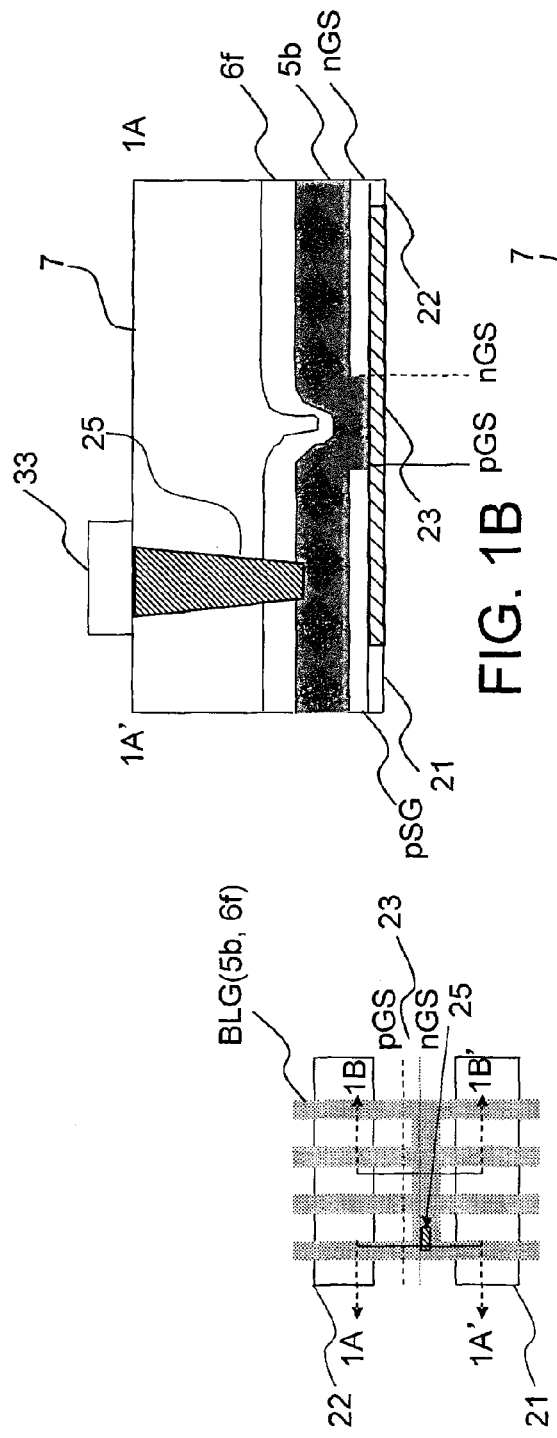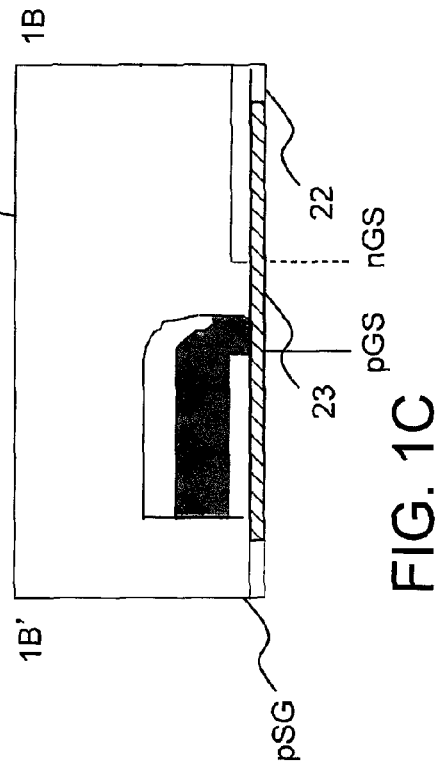
FIG. 1A
FIG. 1B
FIG. 1C

SEMICONDUCTOR DEVICE, DESIGNING METHOD THEREFOR, AND MANUFACTURING METHOD THEREFOR

This application is based upon and claims the benefit of priority from Japanese patent application No. 2012-088775, filed on Apr. 9, 2012, the disclosure of which is incorporated herein in its entirety by reference.

BACKGROUND OF THE INVENTION

1. Field of the Invention

This invention relates to a semiconductor device and a method of designing and manufacturing the semiconductor device.

2. Description of the Related Art

Description is made in Japanese Unexamined Patent Application Publication Nos. 2006-024594 and 2007-329237 about a metal-insulator-semiconductor field effect transistor (MISFET) which includes a so-called High-K insulating film made of a material having a high permittivity (High-K) and a gate electrode and a gate wiring which are formed by a metal material on the gate insulating film.

Japanese Unexamined Patent Application Publication No. 2007-329237 points out that, when a CMOS transistor is structured by the above-mentioned MISFET, the threshold voltage of the CMOS transistor cannot be set at a low value, and thus, higher speed and lower power consumption of processing operation of a CMOS logic element can not be accomplished. Accordingly, Japanese Unexamined Patent Application Publication No. 2007-329237 proposes a MIS transistor (so called High-K metal gate (HKMG) transistor) formed of a metal gate having an appropriate threshold voltage and a hafnium-based High-K material.

Japanese Unexamined Patent Application Publication Nos. 2006-024594 and 2007-329237 do not point out a problem which practically arises when MISFETs having different conductivities are arranged adjacent to each other.

Researches by the inventors of this invention revealed that, when a CMOS provided in a peripheral circuit of a DRAM was formed of a MISFET having an HKMG transistor structure, various problems arose.

For the sake of easy understanding of this invention, now, description is made of a problem which arises when a CMOS provided in a peripheral circuit region of a DRAM is formed of an HKMG transistor.

FIG. 24 is a plan view illustrating a peripheral circuit region of a DRAM, and FIG. 25 shows sectional views taken along the line A-A' of FIG. 24. In FIG. 24, MISFETs having different conductivities are formed in two active regions 21 and 22, respectively, and an element isolation region (STI) 23 defined by two broken lines is formed between the two active regions 21 and 22. A gate wiring BLG connected to gate electrodes of the MISFETs formed in the active regions 21 and 22 is led from the respective active regions. The gate wiring BLG is commonly connected to the MISFETs having different conductivities, and is connected via a contact 25 (FIG. 24) to a conductive layer (not shown) provided above the gate wiring BLG. In the illustrated example, the contact 25 is formed on the STI 23. Further, the gate wiring BLG is connected to gate wirings and gate electrodes (not shown) provided in element formation regions.

Reference is now made to FIG. 25(a). The STI 23 is formed on a semiconductor substrate. An NMOS gate stack (NGS) 26 and a PMOS gate stack (PGS) 27 are provided, which are insulated and separated from each other with the STI 23 interposed therebetween. The NGS 26 is formed of a High-K insulating film, an NMOS metal gate, and polysilicon, while the PGS 27 is formed of a High-K insulating film, a PMOS metal gate, and polysilicon.

In this state, as illustrated in FIG. 25(b), a polysilicon film 28 containing impurities is formed, and further, as illustrated in FIG. 25(c), WSi/WN/W are stacked in this order to form a wiring layer 29, thereby forming the gate wiring BLG. As is clear from FIG. 25(c), a depression 30 is inevitably formed in the gate wiring BLG over the region of the STI 23. Specifically, in a CMOS FET of this kind, when two transistors are connected by the gate wiring BLG, a level difference due to the depression 30 is caused.

In the state illustrated in FIG. 25(c), as illustrated in FIG. 26, an interlayer insulating film 31 of SiN or the like is formed on the gate wiring BLG, and then, the contact 25 is formed at the part of the depression or groove 30. In this case, as illustrated in FIG. 26, there are observed phenomena such as formation of a crevice (seam) in the contact 25 resulting in a contact failure and a defect in which the contact 25 itself pierces the polysilicon 29.

SUMMARY OF THE INVENTION

This invention seeks to solve one or more of problems resulting from a contact failure associated with formation of an element isolation region or formation of a level difference.

According to a first aspect of the present invention, there is provided a semiconductor device, comprising an element isolation region formed on a semiconductor substrate, an active region defined by the element isolation region, a first gate stack including a first High-K material and a first metal material so that the first gate stack has a first work function, the first gate stack extending on the active region and the element isolation region, a second gate stack including a second High-K material and a second metal material so that the second gate stack has a second work function different from the first work function, the second gate stack extending on the element isolation region so that a gap is provided on the element isolation region between the first and second gate stacks, a first conductive layer formed on the first and second gate stacks and in the gap, a second conductive layer formed on the first conductive layer so that the second conductive layer extends over the first and second gate stacks and the gap, an insulating film formed on the second conductive layer so that the insulating film extends over the first and second gate stacks and the gap, the insulating film having a contact hole exposing the second conductive layer over a portion overlapping the element isolation region and one of the first and second gate stacks, and a contact formed in the contact hole.

According to a second aspect of the present invention, there is provided a semiconductor device, comprising an element isolation region formed on a semiconductor substrate, a first active region formed on the semiconductor substrate, the first active region being defined by the element isolation region, a first High-K layer and a first metal layer formed on the first active region and the element isolation region, a first portion of the first High-K and metal layers constituting a first transistor of a first conductivity type on the first active region, a second active region formed on the semiconductor substrate, the second active region being isolated from the first active region with the element isolation region, a second High-K layer and a second metal layer formed on the second active region and the element isolation region, the second High-K and metal layers being physically separated from the first High-K and metal layers, thereby forming a gap over the element isolation region therebetween, a first portion of the second High-K and metal layers constituting a second transistor of a second conductivity type formed on the second active region, a first wiring formed on and connected to the first metal layer, the first wiring extending over the second metal layer beyond the gap from the first active region, a second wiring formed on and connected to the first portion of the second metal layer, the second wiring extending over the first metal layer beyond the gap from the second active region, and a contact formed on and connected to a second portion of the second metal layer, the second portion of the second metal layer being physically separated from the first portion of the second metal layer.

According to this invention, the semiconductor device and the manufacturing method therefor can be obtained capable of eliminating a contact failure due to the influence of a level difference in the element isolation region and the like.

BRIEF DESCRIPTION OF THE DRAWINGS

In the accompanying drawings:

FIGS. 1A to 1C schematically illustrate a structure according to this invention, in which FIG. 1A is a plan view of the structure according to this invention, FIG. 1B is a sectional view taken along the line 1A-1A' of FIG. 1A, and FIG. 1C is a sectional view taken along the line 1B-1B' of FIG. 1A;

Figure 2:
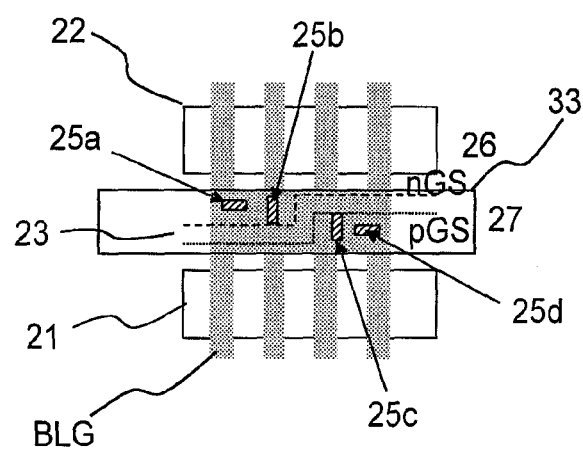
FIG. 2 schematically illustrates another structure according to this invention.

DETAILED DESCRIPTION OF THE PREFERRED EMBODIMENT (Schematic Structure of This Invention)

A structure of this invention is schematically described with reference to FIGS. 1A to 1C. In FIGS. 1A to 1C, a border portion is defined by ends of two gate stacks pGS and nGS on an element isolation region (STI) 23 surrounded by two broken lines, and gate wirings BLG are formed to cross the border portion. The nMOS gate stack nGS is formed on an active region 21 and on the STI 23, and includes a High-K material and a metal electrode material having a first work function. In this case, the High-K material which forms the nMOS gate stack nGS is made of, for example, $HfO_2$ having a permittivity k of about 25.

The pMOS gate stack pGS is formed on an active region 22 and on the STI 23, and includes a High-K material and a metal electrode material having a second work function different from the first work function. The High-K material which forms the pMOS gate stack pGS is, for example, a stacked film of $HfO_2$ and AlO. By stacking an AlO layer, the threshold voltage Vt is reduced.

As the metal electrode materials of the gate stacks nGS and pGS, different materials are used so that the gate stacks nGS and pGS have different work functions. For example, the metal electrode materials of the gate stacks nGS and pGS are each formed of a stacked film of TiN and polysilicon. In order to cause the work functions thereof to be different from each other, the TiN layer of the metal electrode material of the gate stack nGS is set thinner than the TiN layer of the metal electrode material of the gate stack pGS, or, the TiN layer of the gate stack nGS is caused to be TiN-rich while the TiN layer of the gate stack pGS is caused to be N-rich. The gate wirings BLG each include a silicon conductive film 5b and a tungsten film 6f.

As illustrated in FIGS. 1A and 1B, a contact 25 is displaced or shifted from the border portion so as to avoid the border portion, to thereby prevent the above-mentioned contact failure. The contact 25 is embedded in an interlayer insulating film 7 so as to connect the gate wirings BLG and an upper wiring 33. In this embodiment, the contact 25 is provided over the gate stack pGS, but the contact 25 may be formed over the gate stack nGS.

Note that, in the embodiment illustrated in FIGS. 1A to 1C, there are four gate stacks and four gate wirings which cross the active regions 21 and 22, and the gate stacks and the gate wirings are commonly connected via a communicating portion illustrated in FIGS. 1A and 1C. However, the layout of the gate stacks and the gate wirings is not required to be limited to this embodiment. For example, one gate stack and one gate wiring may cross or may be placed over the active regions.

FIG. 2 illustrates another structure according to this invention. As illustrated in FIG. 2, each border portion defined by ends of respective gate stacks nGS 26 and pGS 27 is placed at different positions on the right side and the left side of FIG. 2.

Specifically, on the left side, the end of the gate stack nGS 26 is partly expanded, and contacts 25a and 25b are arranged in the extended region. On the right side, contacts 25c and 25d are provided in an expanded end portion of the gate stack pGS 27 which is partly expanded. The distance between the ends of the gate stacks nGS and pGS may be substantially constant. In the structure illustrated in FIG. 2, the contacts 25a to 25d are provided for the four gate stacks or gate wirings, respectively, which cross the active regions 21 and 22. This structure can also eliminate the contact failure. Note that, the contacts are electrically connected to the upper wiring 33 via the interlayer insulating film. Further, each of the contacts is in the shape of an elongated rectangle seen in plan view, and a plurality of contacts which are transversely elongated or longitudinally elongated are provided on one gate wiring.

Figure 3:
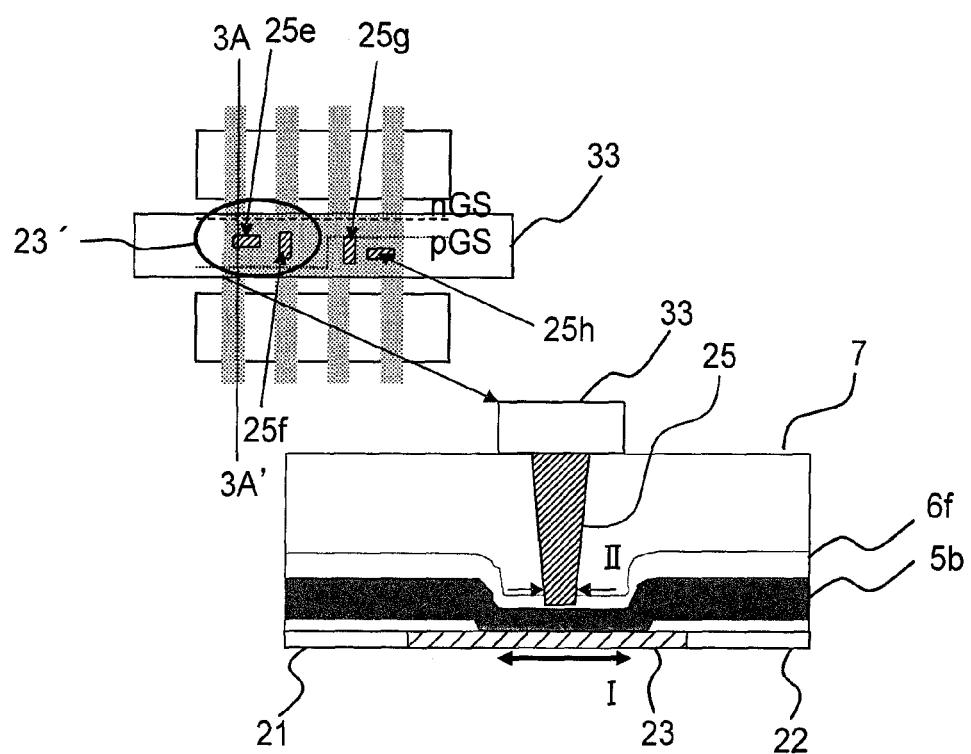
FIG. 3 schematically illustrates still another structure according to this invention.

FIG. 3 illustrates still another structure according to this invention. In this case, the distance between the ends of the gate stacks nGS and pGS is increased to expand the region of the border portion. This expansion causes an upper surface of the gate wiring formed of the films 5b and 6f of the border portion to be flat, and contacts 25e and 25f of the gate stack nGS are provided in the flat portion. A width I of the flat portion is larger than a diameter II of a bottom portion of the contact 25. On the other hand, contacts 25g and 25h of the gate stack pGS are arranged outside the border portion. This structure can also eliminate a defect of the contacts 25e and 25f of the gate stack nGS which are arranged on an STI 23'.

(Embodiment of this Invention)

A semiconductor device as an embodiment to which this invention is applied is described in detail in the following with reference to the attached drawings. In this embodiment, a case in which this invention is applied to a dynamic random access memory (DRAM) as the semiconductor device is described as an example. Note that, the drawings which are referred to in the following description may be partly enlarged for the sake of convenience and easy understanding of characteristic features of this invention, and are not necessarily identical with a practical scale. Further, materials, dimensions, and the like in the following description are only exemplary, and this invention is not necessarily limited thereto and appropriate modifications are possible within the gist of this invention.

First, the structure of the DRAM (semiconductor device) as the embodiment to which this invention is applied is described. The DRAM of this embodiment includes a memory cell region M and a peripheral circuit region C illustrated in FIG. 4.

Figure 4:
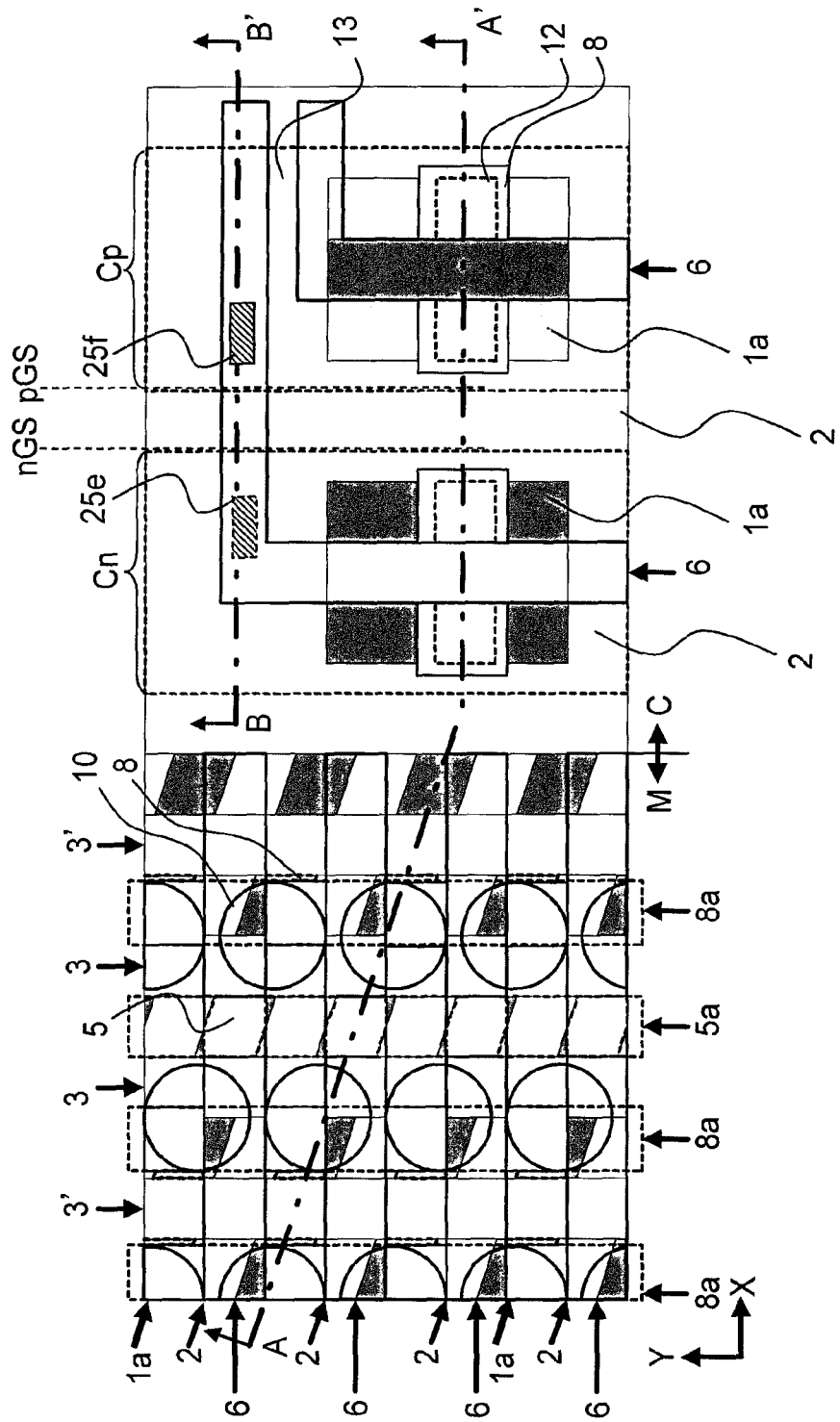
FIG. 4 is a plan view of a DRAM to which this invention can be applied.

As illustrated in FIG. 4, in the memory cell region M of the DRAM (semiconductor device) of this embodiment, a plurality of element isolation regions 2 and a plurality of active regions 1a are formed in the shape of stripes in a predetermined direction at predetermined intervals. Further, buried gate electrodes 3 to be word lines and buried wirings 3' for element isolation are buried and formed in a predetermined direction (Y direction in FIG. 4) at predetermined intervals so as to cross the active regions 1a. Further, a plurality of bit line gates 6 are arranged at predetermined intervals in a direction orthogonal to the buried gate electrodes 3 and the buried wirings 3' (X direction in FIG. 4).

Memory cells are formed in regions in which the buried gate electrodes 3 and the active regions 1a intersect. The buried gate electrode (word line) 3 and the buried wiring 3' has the same structure, but their functions are different. In this case, while the buried gate electrode 3 is used as a gate electrode of a memory cell, the buried wiring 3' for element isolation is provided for isolating adjacent transistors by applying a predetermined potential. Specifically, the buried wiring 3' for element isolation is kept at a predetermined potential. As a result, adjacent transistors on one active region 1a are isolated from each other and a parasitic transistor is held in an off state.

A plurality of memory cells are formed in the entire memory cell region M. Capacitors 10 are provided in the memory cells. Capacitor contact plugs 8 of the capacitors 10 are arranged at predetermined intervals so as not to overlap one another in the memory cell region M as illustrated in FIG. 4.

On the other hand, in the peripheral circuit region C, an NMOS region (#1GS) Cn and a PMOS region (#2GS) Cp are arranged with an element isolation region (STI) 2 therebetween. The active region 1a in which the surface of a semiconductor substrate 1 is exposed is provided in each of the NMOS region (#1GS) Cn and the PMOS region (#2GS) Cp. The active region 1a is divided into two by a gate line (hereinafter referred to as bit line gate BLG) 6 which is formed simultaneously with the bit line in the memory cell region M.

The active regions 1a on both sides of the bit line gate BLG are a source and a drain, and form a peripheral transistor.

The bit line gate 6 in the NMOS region (#1GS) Cn in the peripheral circuit region C extends beyond the border between the NMOS region (#1GS) Cn and the PMOS region (#2GS) Cp and is connected to a portion (not shown) on the right side of FIG. 4.

In this structure, the contacts are connected to the gate electrodes in the NMOS region (#1GS) Cn and in the PMOS region (#2GS) Cp. This structure dispenses with formation of a contact on the element isolation region (STI) 2 provided on the border between the NMOS region (#1GS) Cn and the PMOS region (#2GS) Cp.

Note that, as is clear from FIG. 4, the DRAM of this embodiment is 6F2 cell DRAM (F is the minimum process dimension).

Next, a method of manufacturing the semiconductor device according to an exemplary embodiment of this invention is described with reference to FIGS. 5 to 21. Note that, FIGS. 5 to 21 are sectional views taken along the line A-A' or B-B' of FIG. 4 in the respective steps for the purpose of illustrating the method of manufacturing the DRAM of this embodiment. The method of manufacturing the semiconductor device according to the exemplary embodiment of this invention substantially includes a step of forming the element isolation regions, a step of forming the buried gate electrodes, a step of forming the bit lines, a step of forming the capacitor contact plugs, a step of forming the capacitors, and a step of forming a wiring layer.

The steps are described in detail in the following.

(Step of Forming Element Isolation Regions)

First, the element isolation regions (STI) 2 for isolating the active regions 1a are formed on the surface of the semiconductor substrate 1 which may be, for example, a silicon substrate. In forming the element isolation regions 2, first, for example, a silicon oxide film ($SiO_2$) and a silicon nitride film ($Si_3N_4$) as a mask are deposited in sequence on the P-type semiconductor substrate 1. Then, the silicon nitride film, the silicon oxide film, and the semiconductor substrate 1 are patterned in sequence using photolithography and dry etching to form element isolation grooves (trenches) for partitioning the active regions 1a on the semiconductor substrate 1. Further, the surface of the semiconductor substrate 1 for the active region 1a is covered with the silicon nitride film as a mask. Then, a silicon oxide film is formed on the surface of the semiconductor substrate 1 which is exposed in each of the element isolation grooves.

Specifically, the silicon oxide film is formed by thermal oxidation on the surface of the semiconductor substrate 1 in each of the element isolation grooves and on the surface of the silicon oxide film and the silicon nitride film which cover the active region 1a of the semiconductor substrate 1. Then, silicon nitride is deposited so as to fill the element isolation grooves, and then etching back is carried out to leave a silicon nitride film at the bottom portion in each of the element isolation grooves. Then, silicon oxide is deposited by, for example, CVD, so as to fill the element isolation grooves, and after that, CMP is carried out until the silicon nitride film as a mask is exposed, to thereby flatten the surface of the substrate. Thus, a silicon oxide film is formed.

In this way, by filling each of the element isolation grooves with a layer structure including the silicon nitride film as a lower layer and the silicon oxide film as an upper layer, the element isolation grooves can be each filled with an insulating film without fail even if the width of the element isolation groove is very small.

Next, the silicon nitride film and the silicon oxide film for a mask are removed by, for example, wet etching. This causes the level of the surface of each of the element isolation grooves (that is, the surface of the silicon oxide film) and the level of the surface of the semiconductor substrate 1 to be substantially the same. In this way, the element isolation regions (shallow trench isolations (STIs)) 2 are formed. (In FIG. 5, the detailed structure of the element isolation region (shallow trench isolation (STI)) 2 is not illustrated.) Further, the element isolation region 2 partitions the active region 1a on the semiconductor substrate 1.

Figure 5:
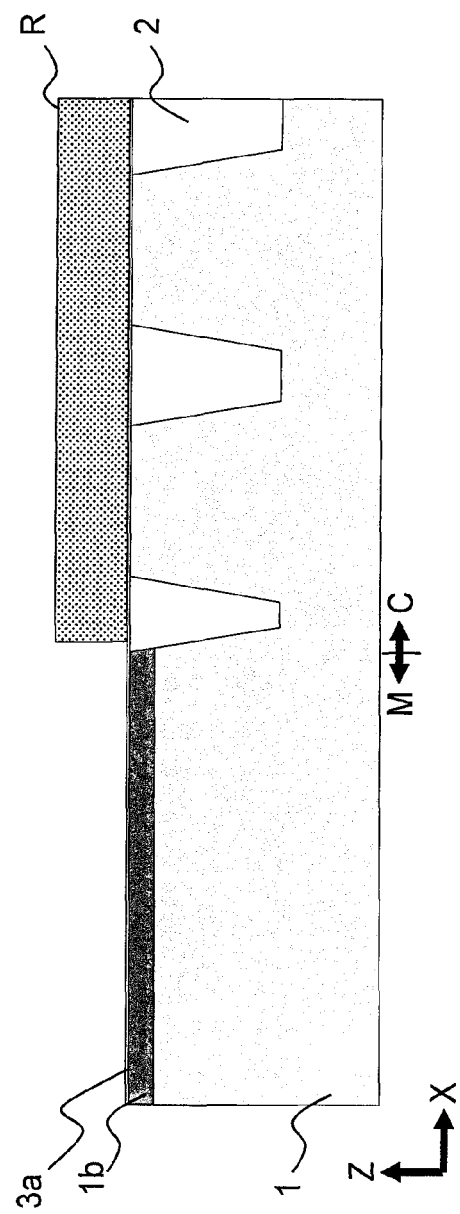
FIG. 5 is a sectional view taken along the line A-A' of FIG. 4, which illustrates a step of a manufacturing method according to an embodiment of this invention.

Then, an impurity diffusion layer is formed on the surface of the memory cell region M of the semiconductor substrate 1. In forming the impurity diffusion layer, first, as illustrated in FIG. 5, a silicon oxide film 3a is formed on the exposed surface of the semiconductor substrate 1 by thermal oxidation. Then, low concentration N-type impurities (such as phosphorus) are ion implanted in the active regions 1a of the semiconductor substrate 1 with the silicon oxide film 3a being used as the mask. In this way, a source/drain diffusion region 1b is formed in proximity to the surface of the semiconductor substrate 1. The source/drain diffusion region 1b functions as part of a source/drain region of a transistor. During the source/drain diffusion region 1b is formed, the silicon oxide film 3a in the peripheral circuit region C is covered with a photoresist R. After the source/drain diffusion region 1b is formed, the photoresist R is removed.

(Step of Forming Buried Gate Electrodes)

Figure 6:
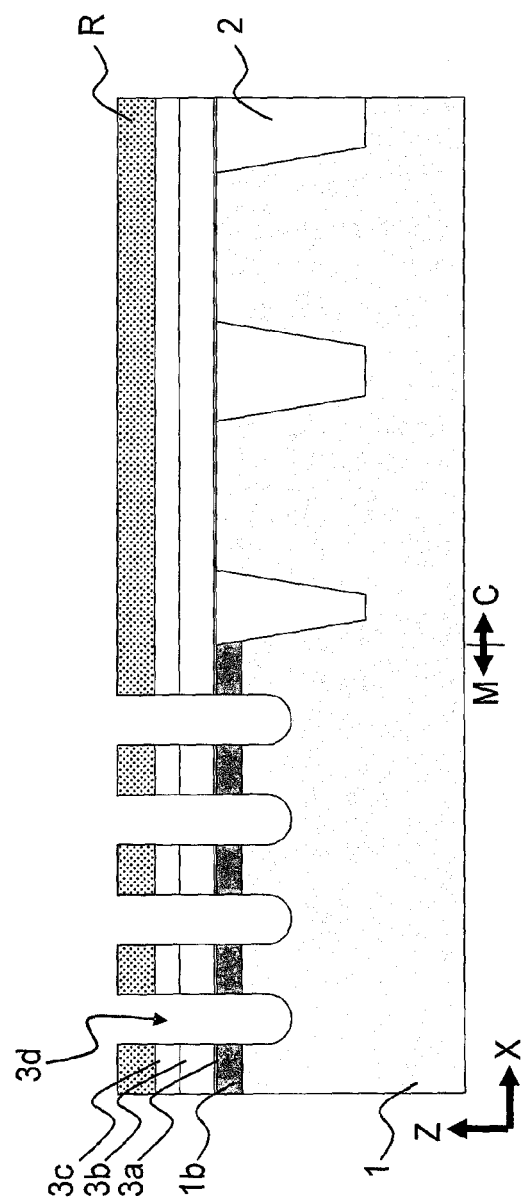
FIG. 6 is a sectional view illustrating a step which is carried out subsequently to the step illustrated in FIG. 5.

Next, buried gate electrodes (word lines) are formed in the memory cell region M. In forming the buried gate electrodes, first, as illustrated in FIG. 6, a silicon nitride film 3b as a mask and a carbon film (amorphous carbon film) 3c are deposited in sequence on the silicon oxide film 3a, and then, the carbon film 3c, the silicon nitride film 3b, and the silicon oxide film 3a are patterned in sequence to form a hard mask for forming gate electrode grooves (trenches) 3d.

Then, by dry etching portions of the semiconductor substrate 1 which are not covered with the hard mask, the gate electrode grooves (trench) 3d are formed. The gate electrode grooves 3d are formed as a line-like pattern extending in a predetermined direction intersecting the active regions 1a (for example, Y direction in FIG. 4). Further, when the gate electrode grooves 3d are formed, the silicon layer of the semiconductor substrate 1 is etched deeper than the surface of the element isolation region 2 so that the surface of the element isolation regions 2 is higher than bottom portions of the gate electrode grooves 3d.

Figure 7:
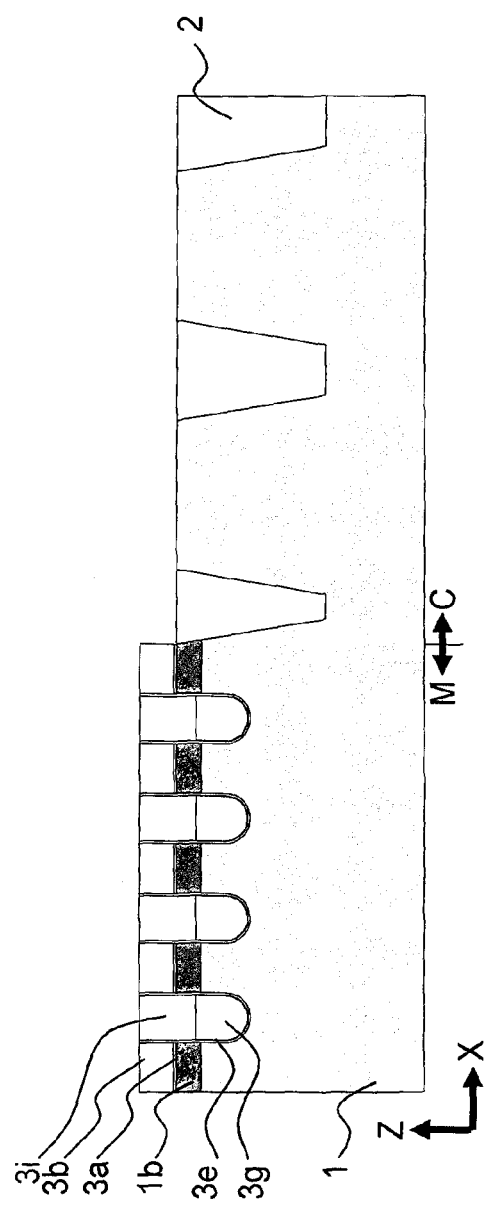
FIG. 7 is a sectional view illustrating a step which is carried out subsequently to the step illustrated in FIG. 6.

Then, as illustrated in FIG. 7, a gate insulating film 3e is formed so as to cover inner wall surfaces of the gate electrode grooves 3d and the surface of the substrate. As the gate insulating film 3e, for example, a silicon oxide film formed by thermal oxidation can be used. Then, gate electrode materials are deposited in sequence on the gate insulating film 3e to fill the gate electrode grooves 3d so as to be buried therein. Specifically, as the gate electrode materials, for example, titanium nitride (TiN) and tungsten (W) are used so that a titanium nitride film (not shown) and a tungsten film 3g fill each of the gate electrode grooves 3d to be buried therein.

Then, the titanium nitride film and the tungsten film 3g which fill each of the gate electrode grooves 3d so as to be buried therein are etched back so that the titanium nitride film and the tungsten film 3g are left only in each of the bottom portions of the gate electrode grooves 3d. In this way, the buried gate electrodes (word lines) 3 and the buried wirings 3' are formed so as to be buried in the gate electrode grooves 3d provided in the semiconductor substrate 1. Note that, the amount of the etching back is adjusted so that the upper surface of the tungsten film 3g which forms each of the buried gate electrodes 3 in the gate electrode grooves 3d is lower (deeper) than the silicon layer of the semiconductor substrate 1 for the purpose of forming the gate electrodes so as to be buried.

Then, for example, a liner film of a silicon nitride film and a cap insulating film 3i of a silicon oxide film are formed on the remaining tungsten film 3g to fill each of the gate electrode grooves 3d.

Then, CMP is carried out to flatten the surface of the substrate until the silicon nitride film 3b as a mask is exposed. After that, the silicon nitride film 3b as a mask and the silicon oxide film 3a in the peripheral circuit region C are removed by etching so that the surface of the semiconductor substrate 1 in the peripheral circuit region C is exposed.

(Step of Forming Bit Line Gates)

Figure 8:
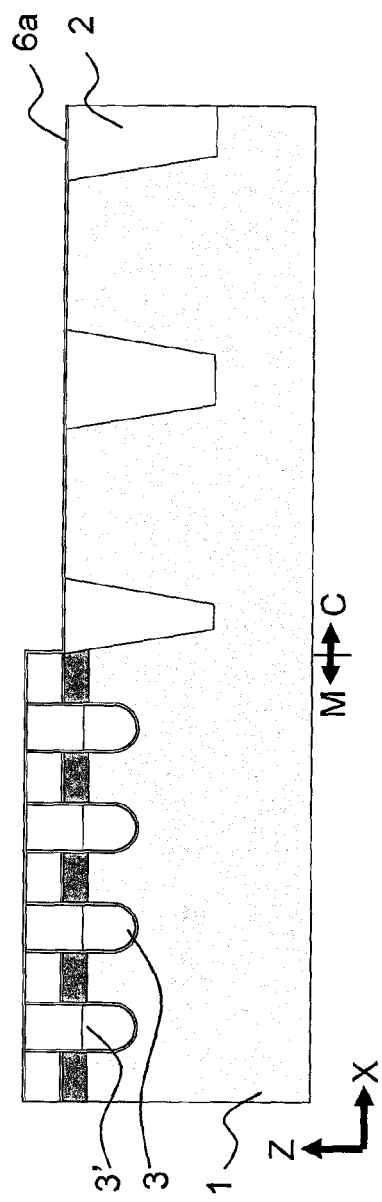
FIG. 8 is a sectional view illustrating a step which is carried out subsequently to the step illustrated in FIG. 7.

Then, as illustrated in FIG. 8, a High-K gate insulating filmA 6a is formed on the entire surface of the semiconductor substrate 1. As a result, the memory cell region M and the peripheral circuit region C are covered with the High-K gate insulating film 6a.

Figure 9:
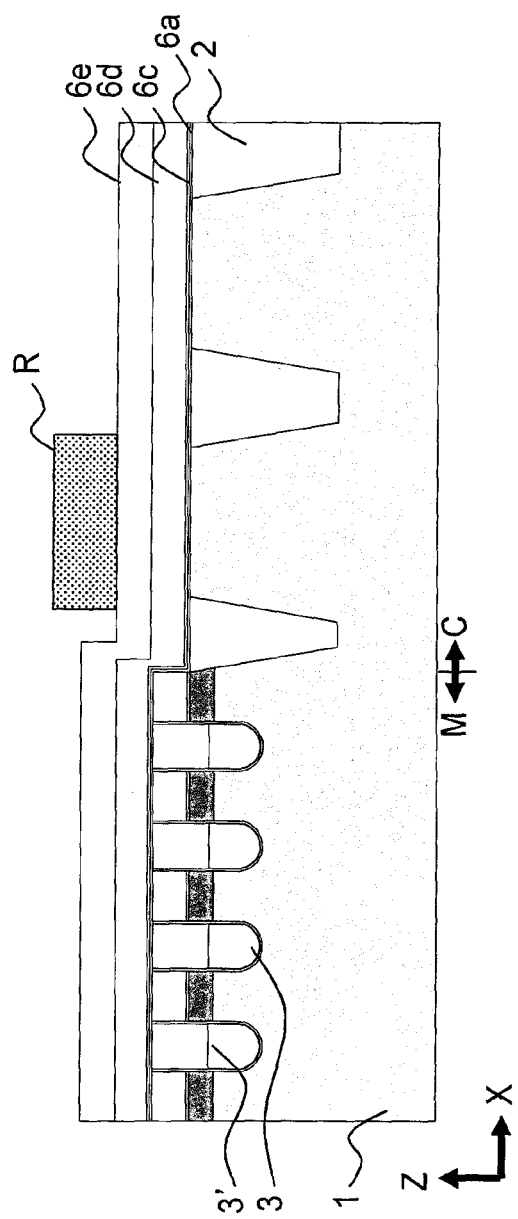
FIG. 9 is a sectional view illustrating a step which is carried out subsequently to the step illustrated in FIG. 8.

Then, as illustrated in FIG. 9, a metal gate 6c, a conductive film 6d, and a mask oxide film 6e are stacked in this order on the High-K gate insulating film 6a, and then, a resist is applied on the entire surface. The photoresist R is applied on the NMOS region (#1GS) Cn, and patterning is carried out by photolithography so that the stacked metal gate 6c, conductive film 6d, and mask oxide film 6e are left. Then, the metal gate 6c, the conductive film 6d, and the mask oxide film 6e in other portions are removed by etching. At this time, the entire High-K gate insulating filmA 6a is left unremoved.

Figure 10:
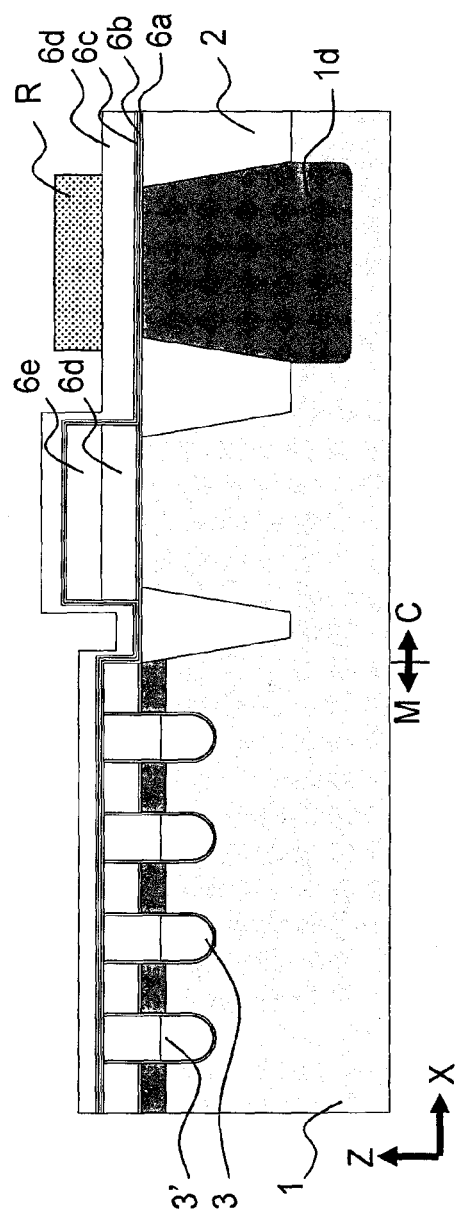
FIG. 10 is a sectional view illustrating a step which is carried out subsequently to the step illustrated in FIG. 9.

Then, as illustrated in FIG. 10, a High-K gate insulating filmB 6b is formed on the entire surface of the semiconductor substrate 1. Then, after the metal gate 6c and the conductive film 6d are stacked in this order on the High-K gate insulating filmB 6b, the resist R is applied on the entire surface, and patterning is carried out by photolithography so that the stacked film in the PMOS region (#2GS) Cp is left unremoved.

Figure 11:
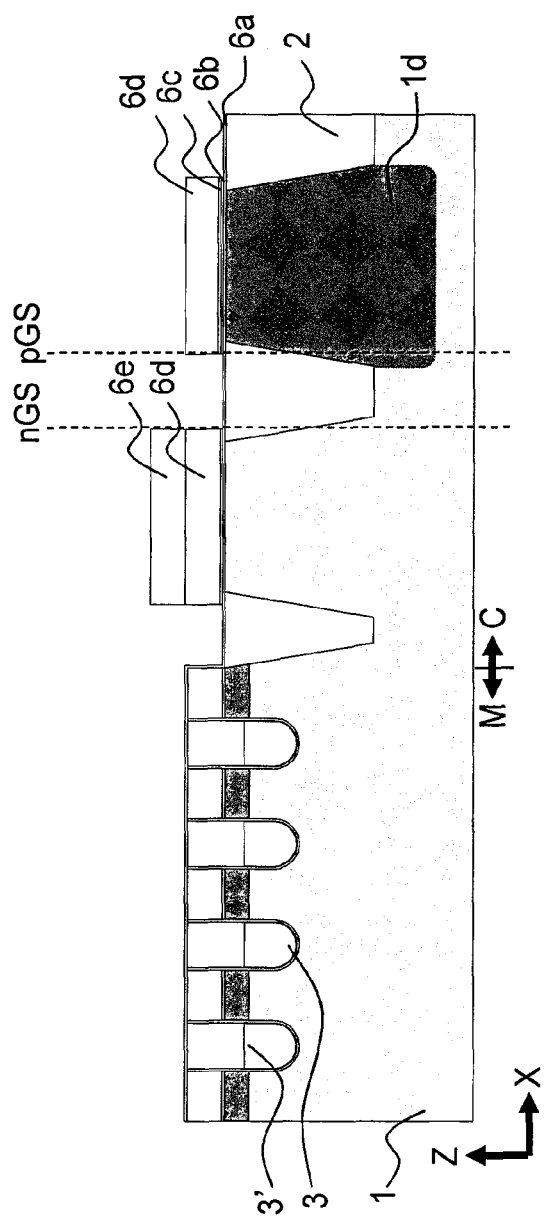
FIG. 11 is a sectional view illustrating a step which is carried out subsequently to the step illustrated in FIG. 10.

Then, as illustrated in FIG. 11, the metal gate 6c, the conductive film 6d, the mask oxide film 6e, and the High-K gate insulating filmB 6b in other portions are removed by etching. As a result, only the High-K gate insulating filmA 6a is left in the memory cell region M and in the NMOS region (#1GS) Cn.

Figure 12:
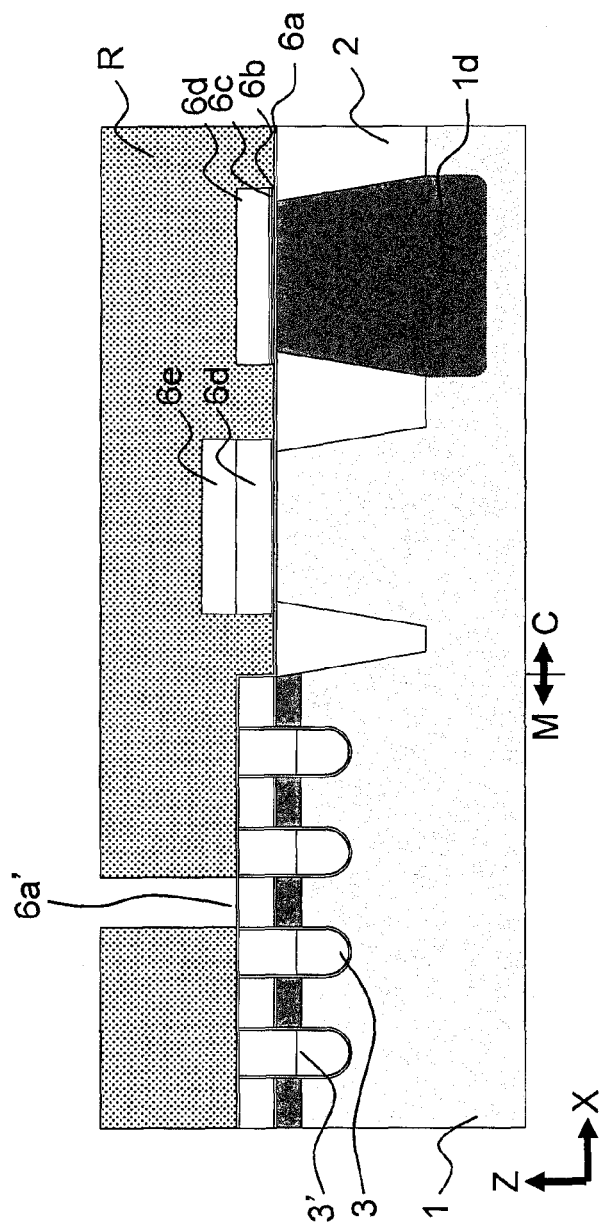
FIG. 12 is a sectional view illustrating a step which is carried out subsequently to the step illustrated in FIG. 11.

In this state, as illustrated in FIG. 12, a resist is applied on the entire surface of the semiconductor substrate 1, a bit contact portion is patterned, the bit contact portion in the High-K gate insulating filmA 6a is damage etched, and a damaged layer 6a' is formed. The damaged layer 6a' in the High-K gate insulating filmA 6a which is damage etched is etched by wet etching.

In this case, according to this embodiment, the entire surface of the semiconductor substrate 1 in the peripheral circuit region C is protected by the High-K gate insulating filmA 6a, and thus, it is not necessary to limit the border between the NMOS region (#1GS) Cn and the PMOS region (#2GS) Cp to a portion on the element isolation region 2 which is sandwiched between the NMOS region (#1GS) Cn and the PMOS region (#2GS) Cp.

Figure 13:
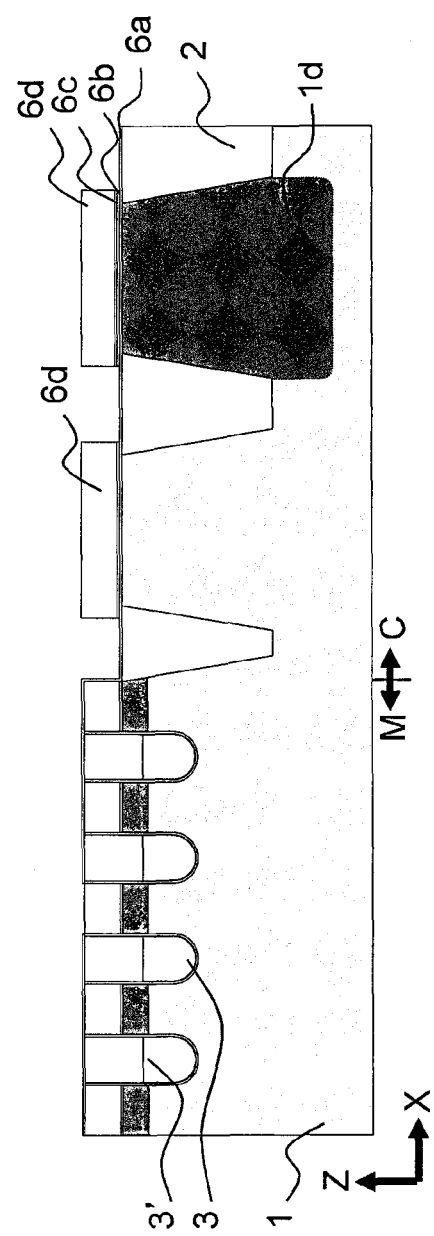
FIG. 13 is a sectional view illustrating a step which is carried out subsequently to the step illustrated in FIG. 12.

Then, as illustrated in FIG. 13, wet treatment is carried out to remove the damaged layer 6a' and the mask oxide film 6e. This causes the surface of the silicon nitride film 3b to be exposed in the bit contact portion in the memory cell region M.

Figure 14:
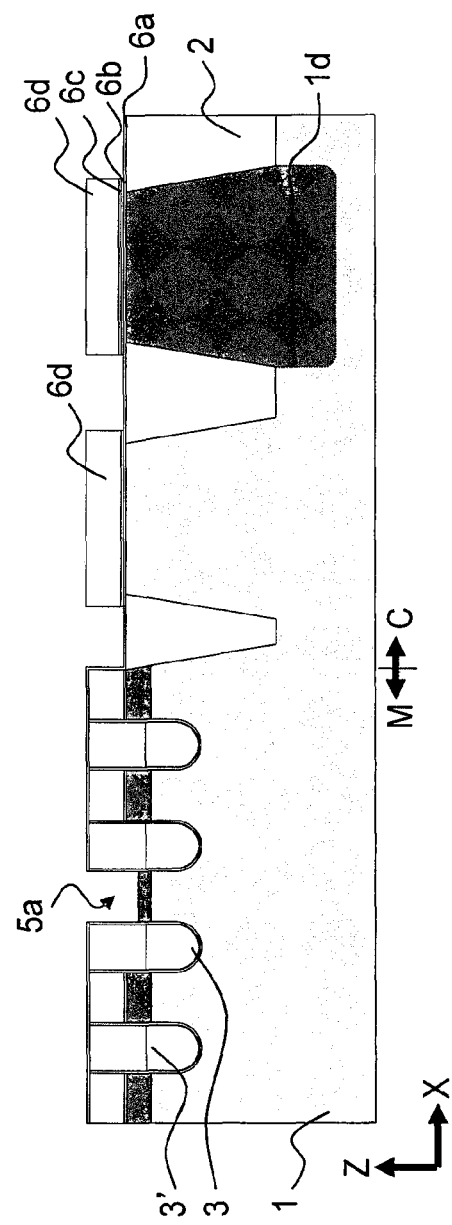
FIG. 14 is a sectional view illustrating a step which is carried out subsequently to the step illustrated in FIG. 13.

Then, as illustrated in FIG. 14, the silicon nitride film 3b and the silicon oxide film 3a in the bit contact portion are etched out by dry etching to form a bit contact hole 5a. This causes the surface of the semiconductor substrate 1 to be exposed at the bottom of the bit contact hole 5a. At this time, the High-K gate insulating filmA 6a can be used as the mask in etching the silicon nitride film 3b and the silicon oxide film 3a.

Figure 15:
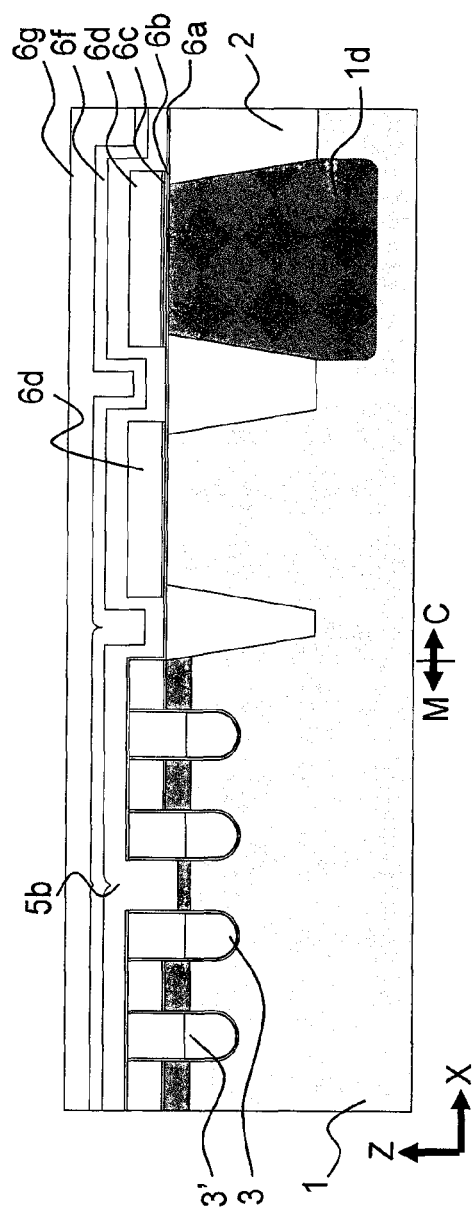
FIG. 15 is a sectional view illustrating a step which is carried out subsequently to the step illustrated in FIG. 14.

Then, as illustrated in FIG. 15, the conductive film 5b of, for example, polysilicon is formed on the entire surface of the semiconductor substrate 1 so as to fill the bit contact hole 5a, and the conductive film 6f of, for example, WN/W and a cap insulating film 6g of, for example, silicon nitride are successively formed thereon in this order. In this case, the entire surface of the semiconductor substrate 1 in the peripheral circuit region C is protected by the High-K gate insulating filmA 6a.

Figure 16:
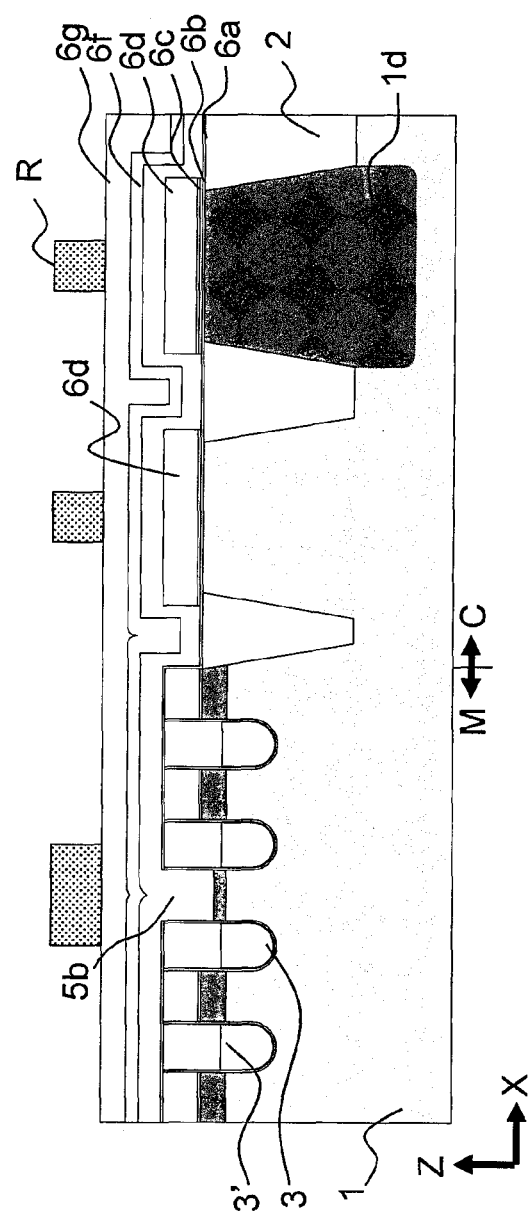
FIG. 16 is a sectional view illustrating a step which is carried out subsequently to the step illustrated in FIG. 15.

Then, as illustrated in FIG. 16, a resist is applied to the entire surface, and patterning is carried out by photolithography so that a bit line in the memory cell region M and the gate lines (bit line gates 6) in the peripheral circuit region C are unremoved.

Figure 17:
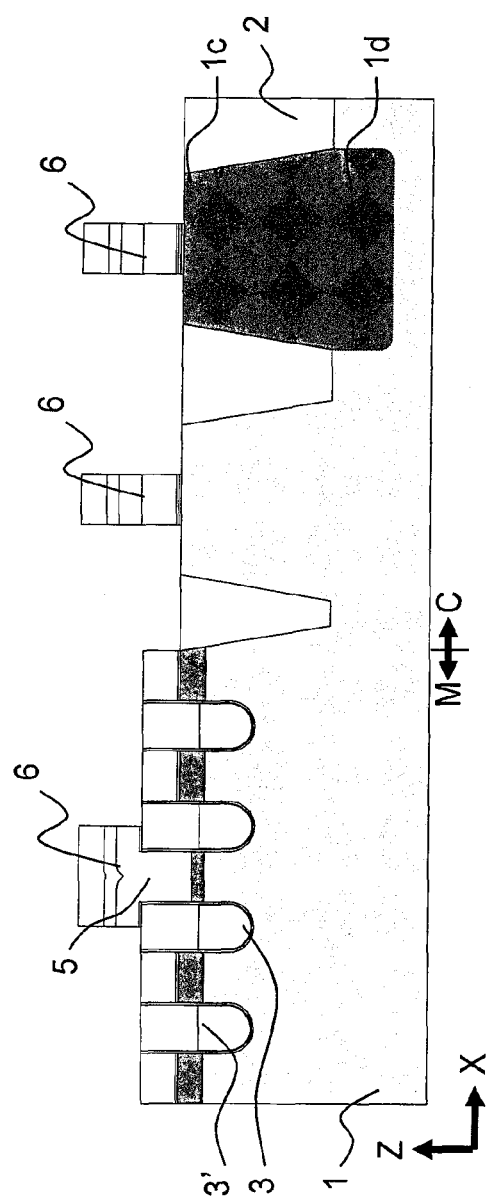
FIG. 17 is a sectional view illustrating a step which is carried out subsequently to the step illustrated in FIG. 16.

Then, as illustrated in FIG. 17, unnecessary portions of the conductive film 5b, the conductive film 6f, and the cap insulating film 6g are etched out by dry etching to form a bit contact 5 and the bit line gates 6. In this way, the bit line gates 6 are formed in the memory cell region M and in the peripheral circuit region C. In this case, the bit line gate 6 in the memory cell region M is formed as a pattern extending in a direction intersecting the buried word lines 3 and the buried wirings 3' (X direction in FIG. 4). Note that, as illustrated in FIG. 4, the bit line gate 6 in the memory cell region M is in a linear shape which is orthogonal to the buried word lines 3A, but this invention is not limited thereto. For example, the bit line gate 6 may be arranged in a partly-curved shape.

(Step of Forming Capacitor Contact Plugs)

Figure 18:
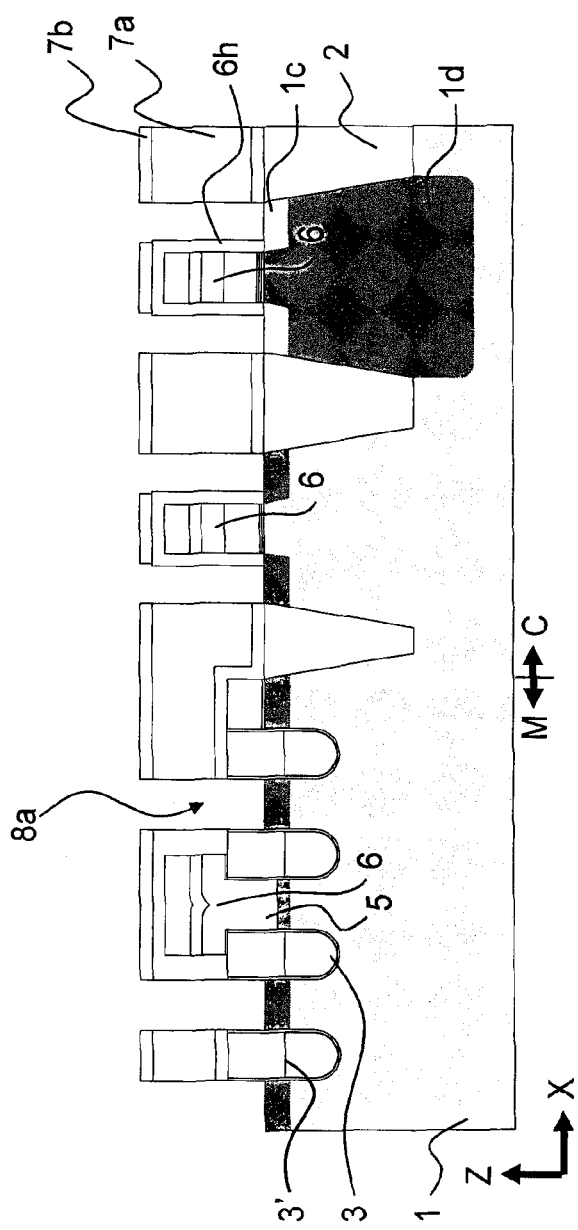
FIG. 18 is a sectional view illustrating a step which is carried out subsequently to the step illustrated in FIG. 17.

Then, as illustrated in FIG. 18, a sidewall insulating film 6h is formed on the entire surface of the semiconductor substrate so as to cover each of the bit line gates 6. As the sidewall insulating film 6h, a silicon nitride film ($Si_3N_4$), a silicon oxynitride film (SiON), or the like can be used.

Figure 19:
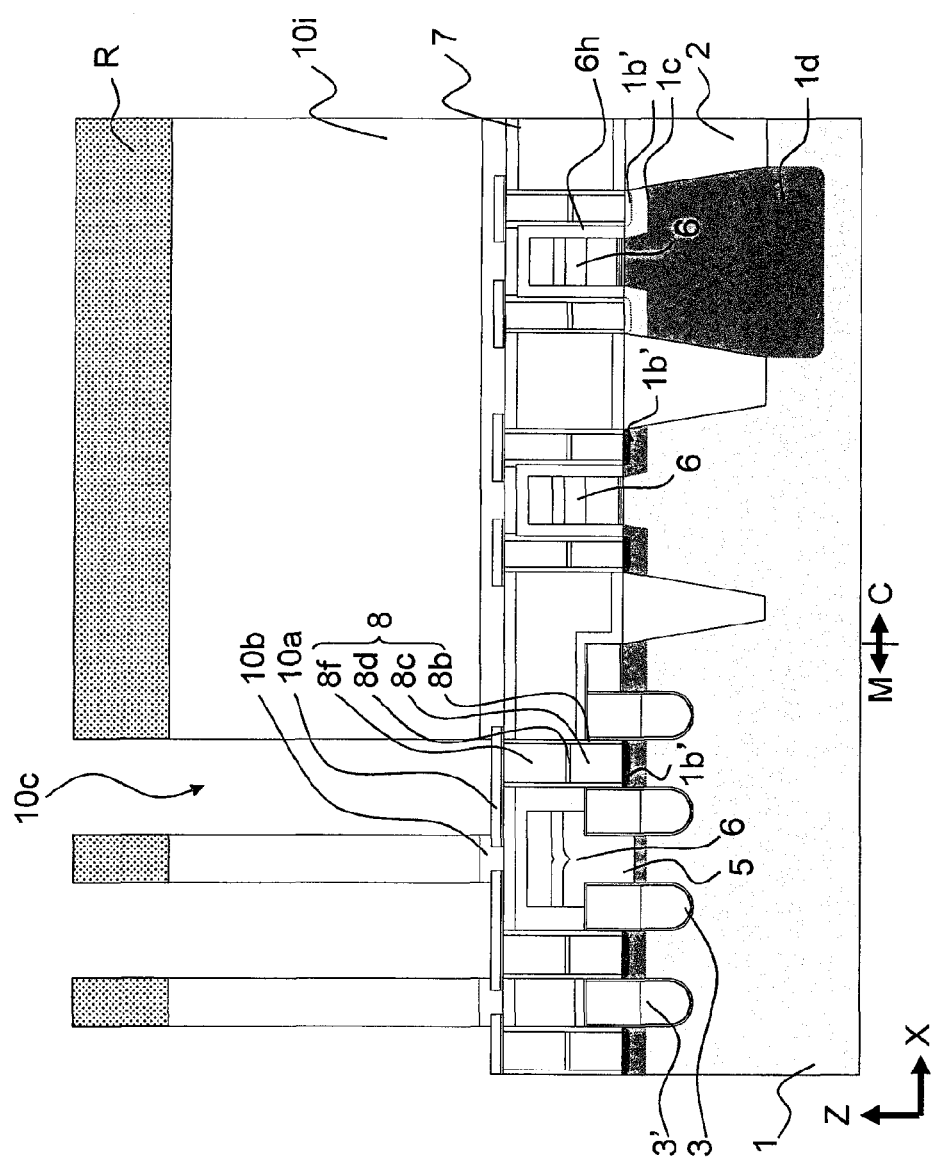
FIG. 19 is a sectional view illustrating a step which is carried out subsequently to the step illustrated in FIG. 18.

Then, as illustrated in FIG. 19, the capacitor contact plugs 8 and a peripheral transistor contact 8' are formed. In forming the capacitor contact plugs 8 and the peripheral transistor contact 8', first, a spin on dielectric (SOD) is applied on the sidewall insulating film 6h to fill space between the bit line gates 6, and then, annealing is carried out in a water vapor ($H_2O$) atmosphere to modify the SOD to a solid film. Thus, an SOD film 7a is formed. After that, CMP is carried out until the upper surface of the sidewall insulating film 6h is exposed, to thereby flatten the surface. Then, a silicon oxide film 7b is formed so as to cover the upper surfaces of the SOD film 7a and the sidewall insulating film 6h to form a second interlayer insulating film 7. Then, photolithography and dry etching are used to form a contact hole 8a. The contact hole 8a is formed by self alignment contact (SAC) using as a sidewall the sidewall insulating film 6h which is formed so as to cover each of the bit line gates 6. Then, by removing the sidewall insulating film 6h from the bottom of the opening by etching, the contact hole 8a is formed. Further, with reference to FIG. 19, a sidewall 8b of, for example, silicon nitride is formed on an inner wall portion of the contact hole 8a. Then, N-type impurities such as phosphorus are ion implanted from the contact hole 8a into the surface of the semiconductor substrate 1 with the second interlayer insulating film 7 being used as the mask. In this way, an N-type impurity diffusion layer is formed in proximity to the surface of the semiconductor substrate 1. The impurity diffusion layer becomes a diffusion region 1b' which functions as the other source/drain region of the transistor. Then, polysilicon containing phosphorus is deposited on the second interlayer insulating film 7 so as to fill the contact hole 8a, and then, etching back is carried out to form a polysilicon layer 8c at the bottom of the contact hole 8a. Then, after a cobalt silicide (CoSi) layer 8d is formed on the surface of the polysilicon layer 8c, tungsten is deposited so as to fill the contact hole 8a, to thereby form a tungsten film. Then, CMP is carried out to flatten the surface until the surface of the second interlayer insulating film 7 is exposed, and tungsten is left in the contact hole 8a. Thus, a W plug 8f is formed. In this way, the capacitor contact plugs 8 and the peripheral transistor contact 8' each including the polysilicon layer 8c, the cobalt silicide layer 8d, and the W plug 8f are formed.

(Step of Forming Capacitors)

Figure 20:
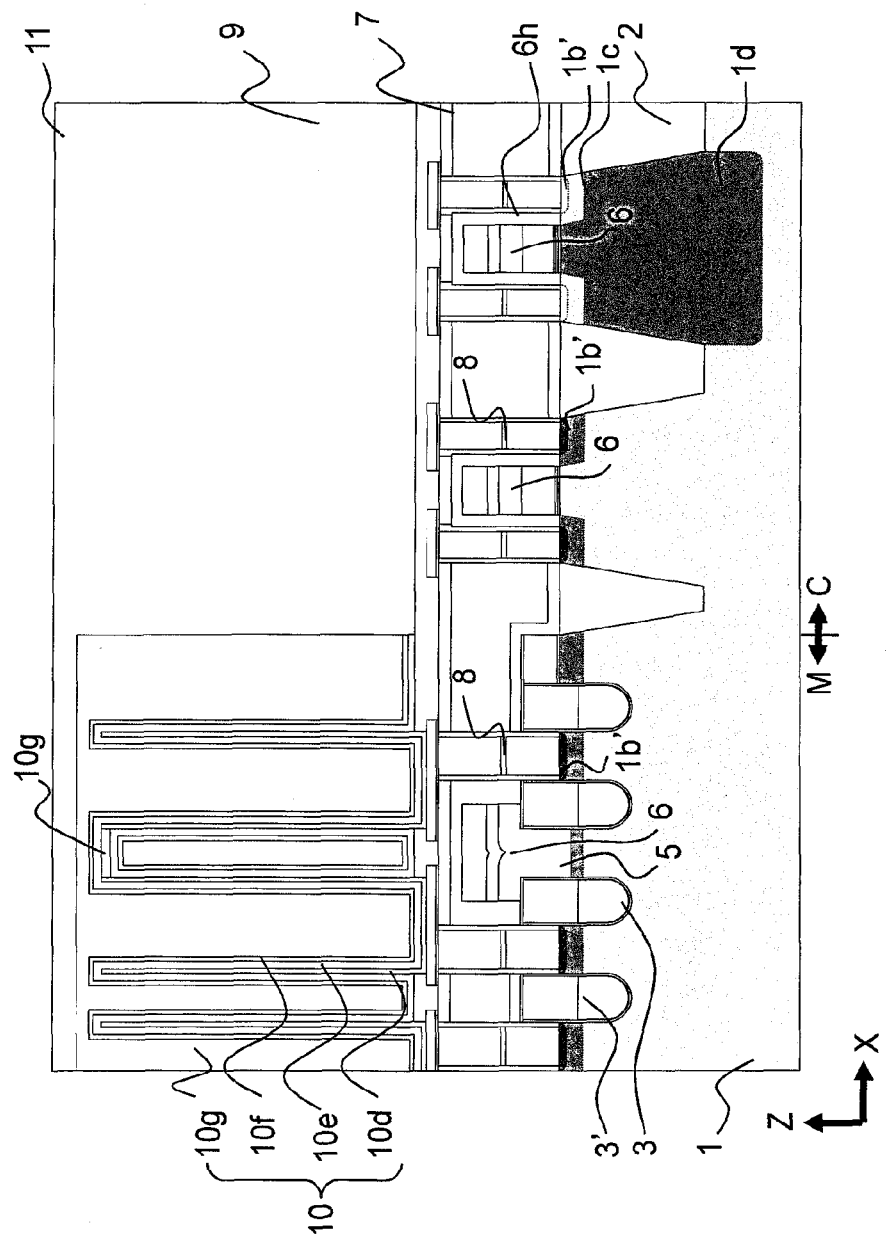
FIG. 20 is a sectional view illustrating a step which is carried out subsequently to the step illustrated in FIG. 19.
Figure 21:
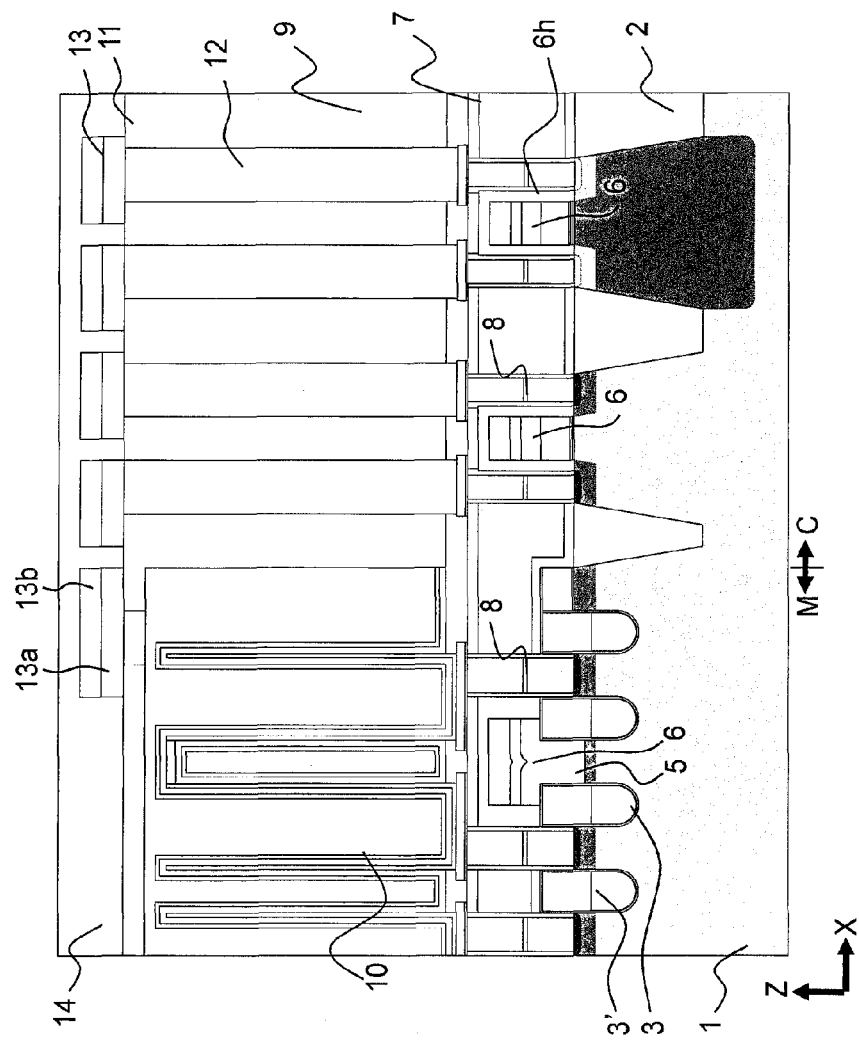
FIG. 21 is a sectional view illustrating a step which is carried out subsequently to the step illustrated in FIG. 20.

Then, as illustrated in FIGS. 19, 20, and 21, capacitors are formed in the memory cell region M. In forming the capacitors, first, as illustrated in FIG. 19, tungsten nitride (WN) and tungsten (W) are deposited in sequence on the surface of the semiconductor substrate 1 after the capacitor contact plugs 8 are formed, to thereby form a stacked film. Then, the stacked film is patterned by photolithography to form capacitor contact pads 10a. In this case, as illustrated in FIG. 4, it is necessary to form the capacitor contact pads 10a at regular intervals in the memory cell region M. Therefore, the capacitor contact pads 10a are formed so as to be offset from locations immediately above the capacitor contact plugs 8, and are connected to the capacitor contact plugs 8 at locations at which the bottom surfaces of the capacitor contact pads 10a and the upper surfaces of the capacitor contact plugs 8 overlap, respectively. Further, in the peripheral circuit region C, a stacked film including tungsten nitride (WN) and tungsten (W) is patterned by photolithography to form a peripheral wiring 10a' simultaneously with the capacitor contact pads 10a. Then, a stopper film 10b of, for example, silicon nitride is formed on the substrate so as to cover the capacitor contact pads 10a and the peripheral wiring 10a'. Then, a sacrificial oxide film 10i of, for example, silicon oxide is formed on the stopper film 10b. Then, capacitor cylinder openings 10c which pierce the sacrificial oxide film 10i and the stopper film 10b on the capacitor contact pads 8 are formed to expose part of the upper surfaces of the capacitor contact pads 10a.

Then, as illustrated in FIG. 20, after a support film 10g is appropriately formed, lower electrodes 10d of the capacitor elements are formed using, for example, titanium nitride so as to cover inner wall surfaces of the capacitor cylinder openings 10c and the upper surfaces of the exposed capacitor contact pads 10a. In this way, the bottom portions of the lower electrodes 10d are connected to the upper surfaces of the capacitor contact pads 10a, respectively. Then, after the sacrificial oxide film 10i is removed, a capacitor insulating film 10e is formed so as to cover the surfaces of the lower electrodes 10d. As the capacitor insulating film 10e, for example, zirconium oxide ($ZrO_2$), aluminum oxide, ($Al_2O_3$), hafnium oxide ($HfO_2$), or a stacked film thereof can be used. Then, upper electrodes 10f of the capacitor elements are formed using, for example, titanium nitride so as to cover the surface of the capacitor insulating film 10e. In this way, the capacitors are formed. Then, an interlayer insulating film 11 of, for example, silicon oxide is formed on the upper electrodes 10f so as to cover the upper electrodes 10f.

(Step of Forming Wiring Layer)

Then, as illustrated in FIG. 21, contact holes are formed by photolithography and etching. The contact holes, in the memory cell region M, pass through the interlayer insulating film 11 to reach the upper electrodes 10f and in the peripheral circuit region C, pass through the interlayer insulating film 11 and the stopper film 10b to reach the peripheral wiring 10a'. Then, after a barrier film (not shown) is formed on inner walls of the contact holes, tungsten is deposited so as to fill the contact holes to form a tungsten film. Then, CMP is carried out to flatten the surface until the surface of the interlayer insulating film 11 is exposed, and tungsten is left in the contact holes. Thus, wiring contacts 12 are formed. Then, a conductive film 13a of, for example, aluminum (Al) or copper (Cu) and a mask insulating film 13b are stacked so as to cover the upper surfaces of the wiring contacts 12 and the surface of the interlayer insulating film 11, and a wiring 13 is formed by photolithography and etching. After that, by forming a protective insulating film 14 so as to cover the wiring 13, the memory cells of the DRAM are completed.

Note that, the manufacturing steps in this embodiment are exemplified at the portion performed in connection with the sectional view taken along the line A-A' of FIG. 4, and the contacts 25 provided in the gate wirings formed by the wirings 5b and 6f of this invention are not illustrated in the sectional views taken along the line A-A'. The contacts 25 of this invention can be provided as, for example, contacts 25e and 25f at predetermined locations on the line B-B' of FIG. 4. The contacts 25e and 25f are formed on the element isolation region 2.

[Method of Arranging Contacts of this Invention]

Figure 22:
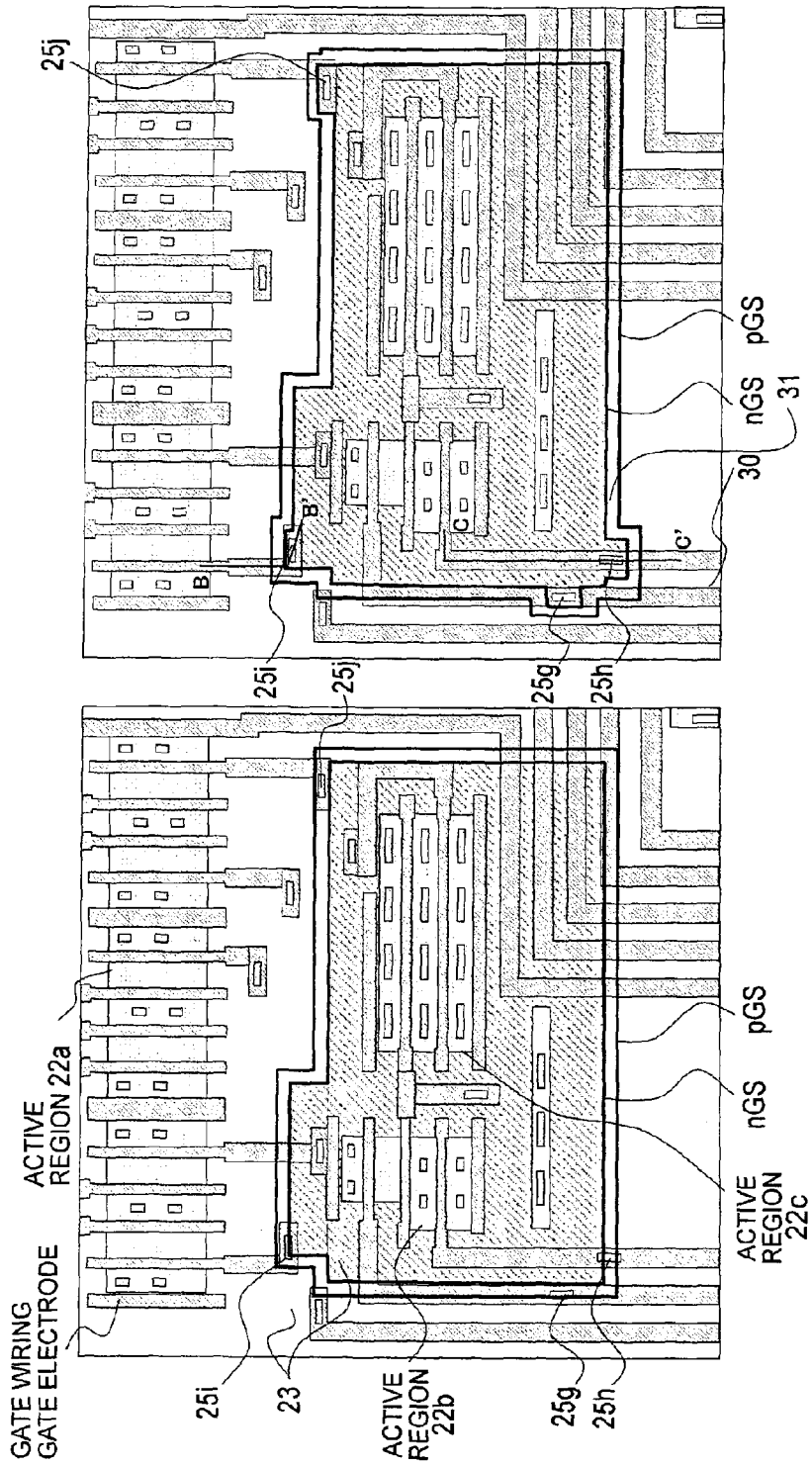
FIG. 22 illustrates a method of arranging contacts according to this invention.

FIG. 22 illustrates a method of arranging contacts according to this invention.

A layout on the left side shows a layout before this invention is applied thereto, and a layout on the right side shows a layout after this invention is applied thereto.

The layout of the semiconductor device relating to this invention is automatically generated by a tool including a CPU, and the tool has an algorithm for implementing this invention mounted thereon.

The tool which is applied to this invention lays out regions of the N-type gate stack nGS and the P-type gate stack pGS based on a predetermined rule, for example, layout information of an N-type well region (1d in FIG. 10). The nGS region is a region surrounded by the pGS region. The above-mentioned level difference portion exists between the nGS region and the pGS region. An active region 22a, 22b, 22c exists in each of the regions, and a transistor having a work function corresponding to the region is formed in the active region.

The layout on the left side of FIG. 22 is generated by a computer based on the layout information illustrated in FIG. 4 or the information on manufacturing steps illustrated in FIGS. 5 to 21.

The algorithm according to this invention specifies the locations of the contacts. As a result, the contacts 25g, 25h, 25i, and 25j are determined to be provided in the level difference portion. The algorithm according to this invention automatically corrects the nGS region and the pGS region so that the nGS region adjacent to those contacts is expanded so as to include the contact formation regions and so that the material of the N-type gate stack nGS exists immediately below the respective contacts. The automatic correction causes the level difference portions which exist immediately below the respective contacts not to exist immediately below the respective contacts any more. The contacts 25g and 25h are each connected to a transistor which exists in the nGS region. Therefore, the gate wirings 30 and the gate electrode material for the gate stack nGS exist immediately below the contacts 25g and 25h. On the other hand, the contacts 25i and 25j are each connected to a transistor which exists in the pGS region, but the contact 25i exists in the nGS region. Therefore, the gate wirings 30 and the gate electrode material for the gate stack nGS exist immediately below the contacts 25i and 25j. In this way, the contacts 25i and 25j are formed on the second gate electrode material (nGS). On the other hand, the contacts 25g and 25h are formed on the first gate electrode material (pGS). In particular, the gate wiring 30 extend over the active region 22b, the element isolation region 23, the gap or level distance portion 31, the element isolation region 23, the gap 31 and the element isolation region 23 in that order. That is, the rearranging algorithm can realize the layout according to this invention. The rearranging algorithm is stored in a storage area in an ordinary computer, and is carried out by arithmetic processing by an arithmetical unit of the computer.

Further, it is also possible to, thorough OR operation of a region which surrounds a contact arranged in proximity to the nGS region at a predetermined distance and the nGS region, correct the region in which the nGS region is formed. Therefore, wirings containing an HKMG material are formed at a predetermined distance in three directions from an end of the contact.

When the wirings including the gate electrodes are patterned as illustrated, the HKMG material is also etched. Therefore, in an end product, the HKMG material does not exist at locations other than locations immediately below the wirings.

Figure 23:
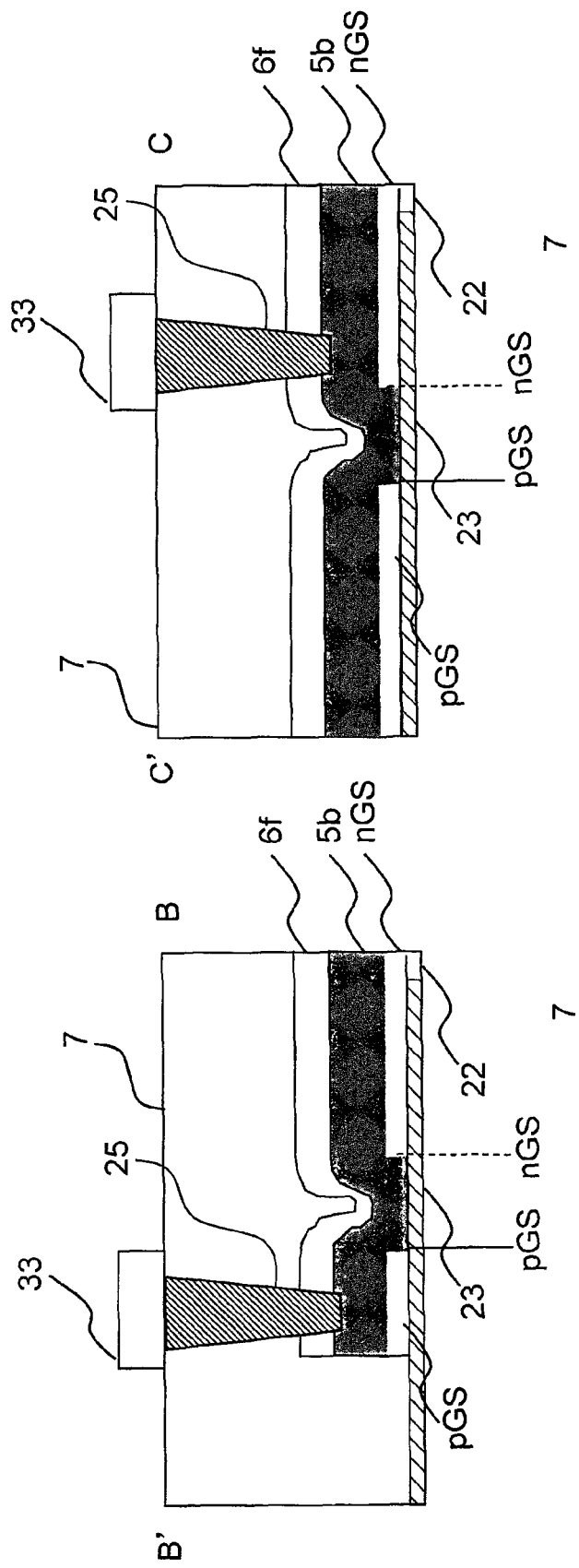
FIG. 23A is a sectional view taken along the line B-B' of FIG. 22.
FIG. 23B is a sectional view taken along the line C-C' of FIG. 22.
Figure 24:
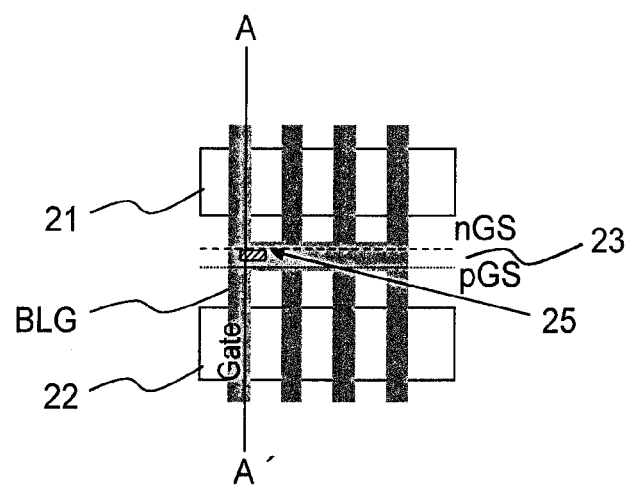
FIG. 24 is a plan view illustrating a problem to be solved by this invention.
Figure 25:
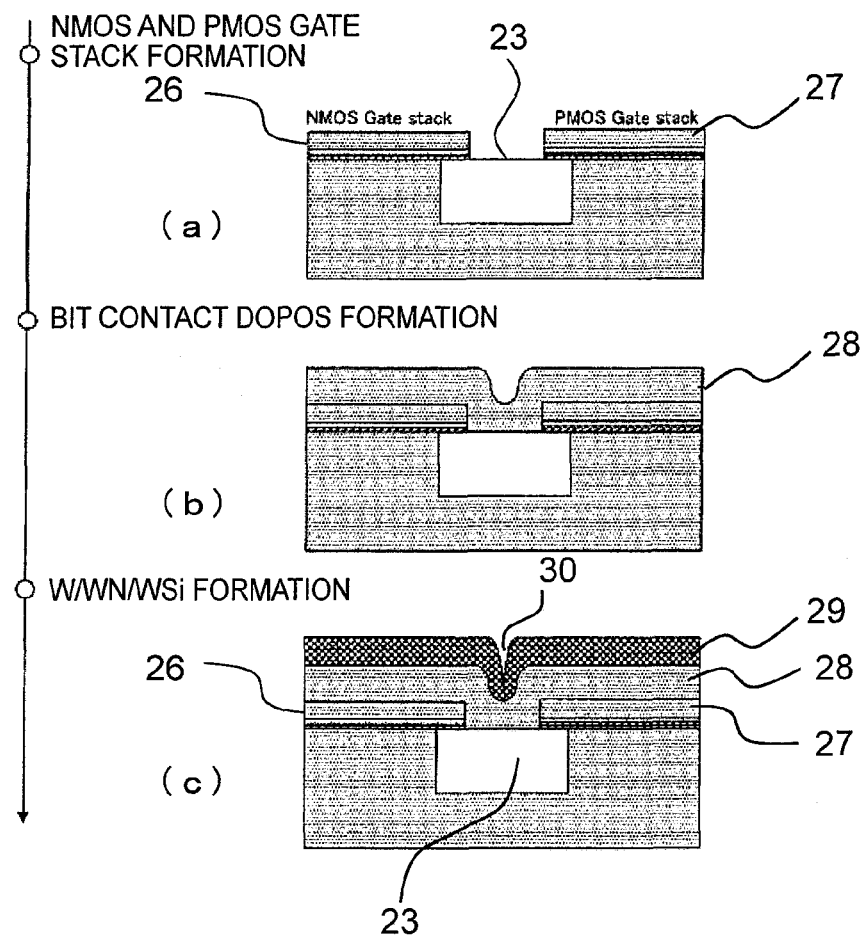
FIG. 25 shows sectional views illustrating steps for obtaining a structure illustrated in FIG. 22 in the order of the steps.
Figure 26:
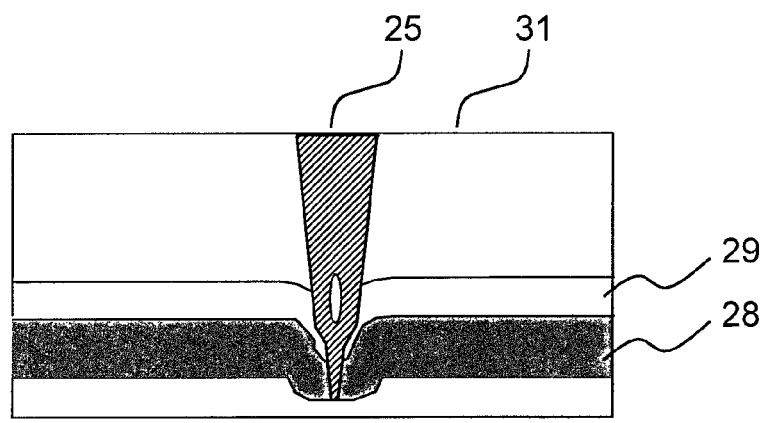
FIG. 26 is an explanatory diagram of a contact failure found by this invention.

FIGS. 23A and 23B are sectional views taken along the line B-B' and C-C', respectively, after the automatic correction illustrated in FIG. 22.

As illustrated in FIG. 23A, the gate stack nGS is deposited on the active region 22 and on the element isolation region 23. On the other hand, the gate stack pGS is deposited on the element isolation region 23 so as to be separated from the gate stack nGS. The gate stacks pGS and nGS are separated from each other, and the level difference portion is formed therebetween. Wirings formed of the silicon conductive film 5b and the tungsten film 6f are formed so as to cover the gate stack nGS on the active region 22 and on the element isolation region 23, the level difference portion, and the gate stack pGS. The wirings do not extend on the active region 21. Part of the wirings form a transistor together with the gate stack nGS and the active region. The contact 25 is formed in a region in which the element isolation region 23 and the gate stack pGS overlap.

As additional illustrated in FIG. 23B, the contact 25 is formed in a region in which the element isolation region 23 and the gate stack nGS overlap.

In the embodiment described above, a case in which this invention is applied to a DRAM is described, but this invention may also be applied to, for example, a CMOS other than a DRAM.

It is apparent that the present invention is not limited to the above embodiments, but may be modified and changed without departing from the scope and spirit of the invention. For, example, in the respective figures, the contact holes each is illustrated to be a complete and ideal rectangular shape from the top view. However, the respective contact holes in an actual product may have a shape which is rounded at the corners thereof, so that the contact holes may have an elliptic or oval shape. The contact holes may be formed with such elliptic or oval shape, which has a first diameter or width in a first direction and a second diameter or width shorter than the first diameter in a second direction perpendicular to the first direction. Moreover, the exemplary embodiments illustrated in FIGS. 1-26 can be combined. For example, any of the arrangement shown in FIGS. 1-4 may be added to the device shown in FIG. 22.

The invention claimed is:

1. A semiconductor device, comprising:
an element isolation region formed on a semiconductor substrate;
an active region defined by the element isolation region;
a first gate stack including a first High-K material and a first metal material so that the first gate stack has a first work function, the first gate stack extending on the active region and the element isolation region;
a second gate stack including a second High-K material and a second metal material so that the second gate stack has a second work function different from the first work function, the second gate stack extending on the element isolation region so that a gap is provided on the element isolation region between the first and second gate stacks;
a first conductive layer formed on the first and second gate stacks and in the gap;
a second conductive layer formed on the first conductive layer so that the second conductive layer extends over the first and second gate stacks and the gap;
an insulating film formed on the second conductive layer so that the insulating film extends over the first and second gate stacks and the gap, the insulating film having a contact hole exposing the second conductive layer over a portion overlapping the element isolation region and one of the first and second gate stacks; and
a contact formed in the contact hole.

2. The semiconductor device as claimed in claim 1, wherein the gap has a space between the first and second gate stacks enough that the second conductive film has a substantial flat top surface over the gap, the semiconductor device further comprising:
a second contact formed in the insulating film to be in contact with the second conductive layer, the second contact formed over the gap and having a diameter, the diameter at a bottom of the second contact being smaller than a width of the substantial flat top surface of the second conductive film.

3. The semiconductor device as claimed in claim 1, wherein the contact is formed over the portion overlapping the element isolation region and the first gate stack.

4. The semiconductor device as claimed in claim 1, wherein the contact is formed over the portion overlapping the element isolation region and the second gate stack.

5. The semiconductor device as claimed in claim 1, wherein the contact is not formed in the gap.

6. The semiconductor device as claimed in claim 1, the semiconductor device further comprising:
a second active region defined by the element isolation region and apart from the active region,
wherein the second gate stuck extends on the second active region,
wherein first and second conductive layers and the insulating film are formed on the second active region.

7. The semiconductor device as claimed in claim 1, wherein the contact has a first width in a first direction and a second width shorter than the first width in a second direction perpendicular to the first direction, from a top view.

8. The semiconductor device as claimed in claim 7, the semiconductor device further comprising:
a second contact formed in the insulating film to be in contact with the second conductive layer and formed over the portion overlapping the element isolation region and one of the first and second gate stack, the second contact having a third width in the first direction and a fourth width longer than the third width in the second direction from the top view.

9. The semiconductor device as claimed in claim 1, wherein the first and second conductive layers extend over a first portion of the first gate stack, the gap, and a second portion of the first gate stack, the gap, then the second gate stack in that order from over the active region, and
wherein the contact is provided over the second portion of the first gate stack.

10. A semiconductor device, comprising:
an element isolation region formed on a semiconductor substrate;
a first active region formed on the semiconductor substrate, the first active region being defined by the element isolation region;
a first High-K layer and a first metal layer formed on the first active region and the element isolation region, a first portion of the first High-K and metal layers constituting a first transistor of a first conductivity type on the first active region;
a second active region formed on the semiconductor substrate, the second active region being isolated from the first active region with the element isolation region;
a second High-K layer and a second metal layer formed on the second active region and the element isolation region, the second High-K and metal layers being physically separated from the first High-K and metal layers, thereby forming a gap over the element isolation region therebetween, a first portion of the second High-K and metal layers constituting a second transistor of a second conductivity type formed on the second active region;
a first wiring formed on and connected to the first metal layer, the first wiring extending over the second metal layer beyond the gap from the first active region;
a second wiring formed on and connected to the first portion of the second metal layer, the second wiring extending over the first metal layer beyond the gap from the second active region;
a contact formed on and connected to a second portion of the second metal layer, the first and second portions of the second metal layer being provided as a discontinuous film so that the second portion of the second metal layer is separated from the first portion of the second metal layer.

11. The semiconductor device as claimed in claim 10, the semiconductor device further comprising:
a second contact formed on and connected to a third portion of the second metal layer, the first and third portions of the second metal layer being provided as a continuous film.

12. The semiconductor device as claimed in claim 11,
wherein the contact has a first width in a first direction and a second width shorter than the first width in a second direction perpendicular to the first direction, from a top view, and
wherein the second contact has a third width in the first direction and a fourth width longer than the third width in the second direction from the top view.

13. The semiconductor device as claimed in claim 10,
wherein the gap has a space between the first High-K and metal layers and the second High-K and metal layers enough that the first wiring has a substantial flat top surface over the gap, the semiconductor device further comprising:
a second contact formed on the first wiring over the gap and having a diameter, the diameter at a bottom of the second contact being smaller than a width of the substantial flat top surface of the first wiring.

14. The semiconductor device as claimed in claim 13,
wherein the contact has a first width in a first direction and a second width shorter than the first width in a second direction perpendicular to the first direction, from a top view, and
wherein the second contact has a third width in the first direction and a fourth width longer than the third width in the second direction from the top view.

\* \* \* \* \*